United States Patent
Mizuno (10) Patent No.: US 10,651,077 B2
(45) Date of Patent: May 12, 2020

(54) ETCHING METHOD (71) Applicant: Tokyo Electron Limited, Tokyo (JP)

(72) Inventor: Hideki Mizuno, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/010,794

(22) Filed: Jun. 18, 2018

(65) Prior Publication Data

US 2018/0374743 A1 Dec. 27, 2018

(30) Foreign Application Priority Data

Jun. 21, 2017 (JP) .................................. 2017-121596

(51) Int. Cl.
| | | |
|---|---|---|
| *H01L 21/768* | (2006.01) | |
| *H01L 21/02* | (2006.01) | |
| *H01L 21/311* | (2006.01) | |

(52) U.S. Cl.
CPC .. *H01L 21/76804* (2013.01); *H01L 21/02063* (2013.01); *H01L 21/31116* (2013.01); *H01L 21/31138* (2013.01); *H01L 21/31144* (2013.01); *H01L 21/76879* (2013.01)

(58) Field of Classification Search
CPC ......... H01L 21/76804; H01L 21/02063; H01L 21/31116; H01L 21/31138; H01L 21/31144; H01L 21/76879; H01L 21/02046–02049; H01L 21/3065–30655; H01L 21/31122; H01L 21/67069; H01L 21/32136–32137; H01L 21/02071; H01J 2237/334–3348

See application file for complete search history.

(56) References Cited

U.S. PATENT DOCUMENTS

| | | | | |
|---|---|---|---|---|
| 2003/0040192 A1* | 2/2003 | Kanegae | ........... | H01L 21/31138 438/710 |
| 2004/0072440 A1* | 4/2004 | Kim | ................. | H01L 21/02063 438/709 |
| 2005/0061445 A1* | 3/2005 | Koshiishi | .......... | H01J 37/32082 156/345.47 |
| 2005/0236362 A1* | 10/2005 | Aoki | ....................... | C11D 7/08 216/57 |
| 2009/0061634 A1* | 3/2009 | Feurprier | .......... | H01L 21/31144 438/700 |
| 2011/0256483 A1* | 10/2011 | Kamata | .................... | C11D 7/10 430/312 |

(Continued)

FOREIGN PATENT DOCUMENTS

JP 2001-257261 9/2001

*Primary Examiner* — Shahed Ahmed (74) *Attorney, Agent, or Firm* — IPUSA, PLLC (57) ABSTRACT An etching method of silicon-containing oxide film is provided. The etching method includes a first step of forming an etching pattern on the silicon-containing oxide film by etching the silicon-containing oxide film using a first plasma generated from a first gas supplied to the processing vessel, according to a pattern of a mask layered on the silicon-containing oxide film, and a second step of removing a reaction product adhering to vicinity of an opening of the etching pattern and to the mask using a second plasma generated from a second gas supplied to the processing vessel, by applying a first high frequency electric power for generating plasma and a second high frequency electric power for generating bias voltage.

6 Claims, 5 Drawing Sheets

ETCHING PHASE

(56) References Cited

U.S. PATENT DOCUMENTS

| | | | |
|---|---|---|---|
| 2012/0244718 A1* | 9/2012 | Nishimura | H01L 21/31116 438/710 |
| 2015/0235861 A1* | 8/2015 | Mizuno | H01L 21/31116 438/702 |
| 2017/0125255 A1* | 5/2017 | Kakimoto | H01L 21/3065 |

* cited by examiner

ETCHING METHOD

CROSS-REFERENCE TO RELATED APPLICATIONS

This patent application is based upon and claims the benefit of priority of Japanese Patent Application No. 2017-121596 filed on Jun. 21, 2017, the entire contents of which are incorporated herein by reference.

BACKGROUND OF THE INVENTION

1. Field of the Invention

The present invention generally relates to an etching method.

2. Description of the Related Art

When silicon oxide film is etched by plasma in a pattern of a mask on the silicon oxide film, a reaction product adheres to vicinity of an opening of the silicon oxide film or an upper surface of the mask. If the reaction product adheres, after the mask is removed from the silicon oxide film by ashing, which is performed after etching, an etching profile of the silicon oxide tends to be of an inverted tapered shape, in which a side wall of an etching pattern formed in the silicon oxide film is not vertical and in which a width of the etching pattern at a bottom side is wider than a width close to the opening of the etching pattern.

If the etching pattern has such etching profile, in a post-process in which the etching pattern is filled with metal, a filling defect, in which a gap (void) is generated, is likely to occur. Because the filling defect affects electrical characteristics of a device, the filling defect should preferably be eliminated.

Patent Document 1 discloses a method of removing a reaction product deposited near an opening of a contact hole formed by etching. In the method disclosed in Patent Document 1, after a contact hole is formed in silicon oxide film on a substrate by etching using plasma generated from gas containing fluorocarbon gas, to remove a photoresist mask, ashing is performed by using plasma generated from oxygen gas. After the ashing, the substrate is exposed to water vapor, and thereby hydrofluoric acid is generated. As a side wall of the contact hole is wet etched by the generated hydrofluoric acid, the reaction product is removed.

However, in the method disclosed in Patent Document 1, because the side wall of the contact hole is wet etched by hydrofluoric acid after the mask on the silicon oxide film is removed by ashing using oxygen gas plasma, an etching profile of the silicon oxide film is not sufficiently improved.

CITATION LIST

Patent Document

[Patent Document 1] Japanese Laid-open Patent Application Publication No. 2001-257261

SUMMARY OF THE INVENTION

In one aspect, the present invention aims at improving an etching profile of silicon-containing oxide film by dry etching.

To solve the above problem, according to an aspect of the present invention, there is provision of an etching method of silicon-containing oxide film performed in a processing vessel of a plasma processing apparatus. The etching method includes a first step of forming an etching pattern on the silicon-containing oxide film by etching the silicon-containing oxide film using a first plasma generated from a first gas supplied to the processing vessel, according to a pattern of a mask layered on the silicon-containing oxide film, and a second step of removing a reaction product adhering to vicinity of an opening of the etching pattern and to the mask using a second plasma generated from a second gas supplied to the processing vessel, by applying a first high frequency electric power for generating plasma and a second high frequency electric power for generating bias voltage.

DETAILED DESCRIPTION OF EMBODIMENTS

In the following, embodiments of the present invention will be described with reference to the drawings. Note that in the following descriptions and the drawings, elements having substantially identical features are given the same reference symbols and overlapping descriptions may be omitted.

[Plasma Processing Apparatus]

Figure 1:
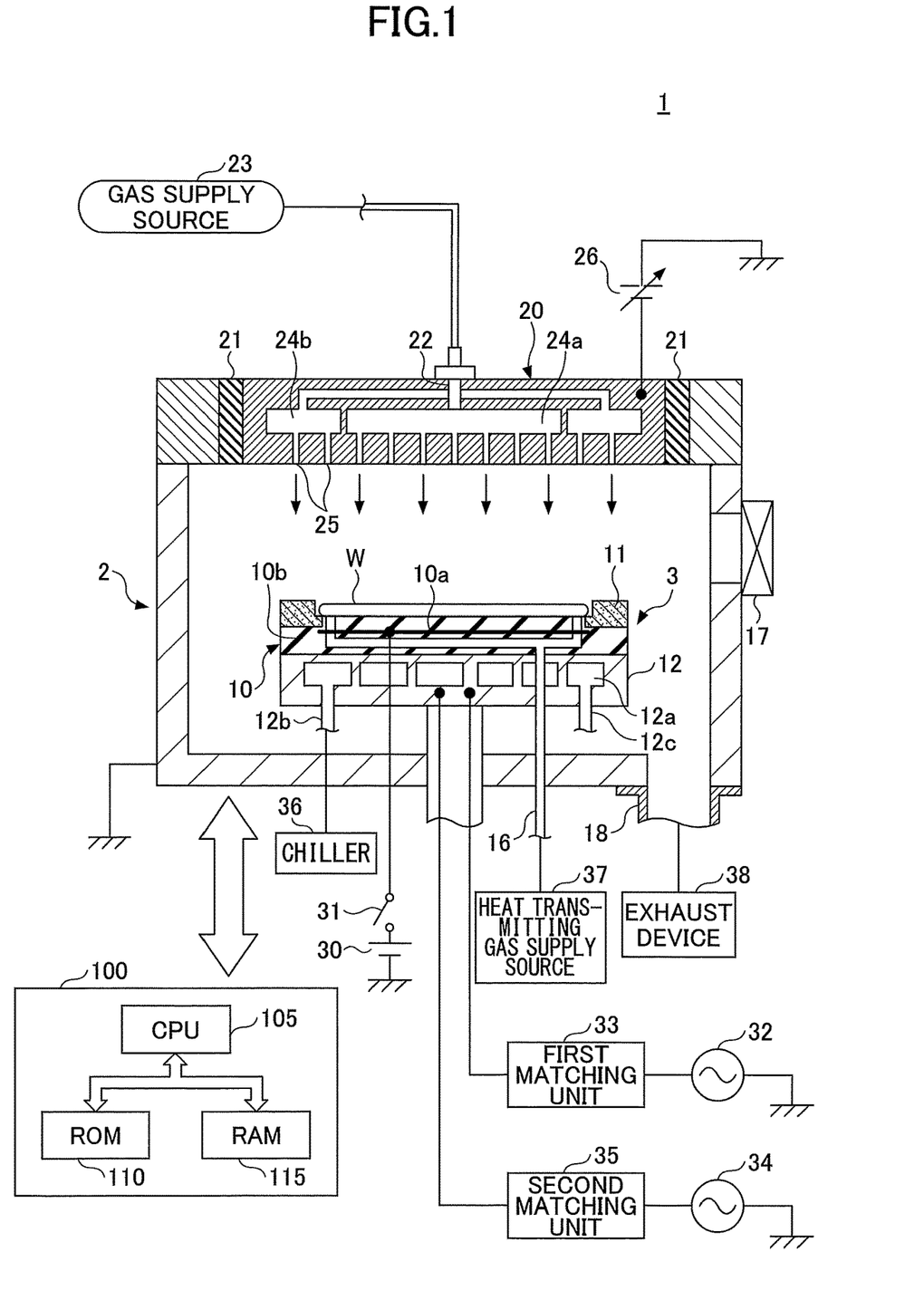
FIG. 1 is a view illustrating an example of a plasma processing apparatus according to a present embodiment.

First, an example of a plasma processing apparatus 1 will be described with reference to FIG. 1. The plasma processing apparatus 1 according to a present embodiment is a capacitively coupled plasma type parallel-flat plate plasma processing apparatus, and includes a substantially cylindrical processing vessel (chamber) 2. To an internal surface of the processing vessel 2, anodic oxidation treatment is applied. An inside of the processing vessel 2 is a processing chamber for performing plasma treatment such as etching or depositing.

A stage 3 is used for placing a semiconductor wafer (hereinafter, it will be referred to as a "wafer") which is an example of a substrate. The stage 3 is formed of, for example, aluminum (Al), titanium (Ti), or silicon carbide (SiC). The stage 3 also acts as a lower electrode (bottom electrode).

An electrostatic chuck (ESC) 10 for attracting a wafer W electrostatically is disposed on the stage 3. The electrostatic chuck 10 is configured such that a chuck electrode 10a is embedded in an insulating member 10b. A direct current power source (DC power source) 30 is connected to the chuck electrode 10a. When a switch 31 is turned on, DC voltage is applied from the DC power source 30 to the chuck electrode 10a and the wafer W is attracted to the electrostatic chuck 10 by the Coulomb force.

On a periphery of the upper surface of the electrostatic chuck 10, an annular focus ring 11 is disposed so as to surround an outer edge of the wafer W. The focus ring 11 is formed of silicon, for example, and improves efficiency of plasma treatment by making plasma converge on a surface of the wafer W in the processing vessel 2.

A lower side of the stage 3 is a supporting member 12. By the supporting member 12, the stage 3 is fixed at a bottom of the processing vessel 2. Inside the supporting member 12, a coolant passage 12a is formed. Coolant such as water or brine that is output from a chiller 36 flows from a coolant inlet pipe 12b to a coolant outlet pipe 12c through the coolant passage 12a and circulates. By the circulating coolant, heat is released and the stage 3 that is formed of metal is cooled.

A heat transmitting gas supply source 37 supplies heat transmitting gas such as helium gas (He), through a gas supply line 16, between an upper surface of the electrostatic chuck 10 and the lower surface of the wafer W. Accordingly, temperature of the electrostatic chuck 10 is controlled with the coolant circulating in the coolant passage 12a and the heat transmitting gas supplied to the lower surface of the wafer W. As a result, the wafer W is maintained in a predetermined temperature.

A first radio frequency power source 32 is connected to the stage 3 via a first matching unit 33, and supplies first high frequency electric power HF of a first frequency for generating plasma. Also, a second radio frequency power source 34 is connected to the stage 3 via a second matching unit 35, and supplies second high frequency electric power LF of a second frequency for generating bias voltage. The first frequency may be, for example, 40 MHz. The second frequency is less than the first frequency, and may be 13.56 MHz, for example. Though the first high frequency electric power HF is applied to the stage 3 in the present embodiment, the first high frequency electric power HF may be applied to a gas shower head 20.

The first matching unit 33 is for matching an internal impedance (or output impedance) of the first radio frequency power source 32 and a load impedance. The second matching unit 35 is for matching an internal impedance (or output impedance) of the second radio frequency power source 34 and a load impedance. The first matching unit 33 acts such that the internal impedance of the first radio frequency power source 32 coincides with the apparent load impedance while plasma is generated in the processing vessel 2. The second matching unit 35 acts such that the internal impedance of the second radio frequency power source 34 coincides with the apparent load impedance while plasma is generated in the processing vessel 2.

The gas shower head 20 is mounted to an opening of a ceiling of the processing vessel 2 through a cylindrical shield ring 21 covering an outer edge of the gas shower head 20, such that the opening is closed with the gas shower head 20. A variable DC power supply 26 is connected to the gas shower head 20, and applies a negative DC voltage to the gas shower head 20. The gas shower head 20 may be formed of silicon. The gas shower head 20 also acts as an opposing electrode (upper electrode) facing the stage 3 (lower electrode).

A gas inlet 22 for introducing gas is formed at the gas shower head 20. Inside the gas shower head 20, a diffusion chamber 24a located in a center of the gas shower head 20 and a diffusion chamber 24b located in the edge side of the gas shower head 20 are provided, and each of the diffusion chambers 24a and 24b is connected to the gas inlet 22. When gas is output from a gas supply source 23, the gas is supplied to the diffusion chambers 24a and 24b via the gas inlet 22 and diffuses in the diffusion chambers 24a and 24b. Then the gas is introduced from the large number of the gas holes 25 to the stage 3.

At a bottom of the processing vessel 2, an exhaust port 18 is formed. Gas in the processing vessel 2 is discharged by an exhaust device 38 connected to the exhaust port 18. According to the structure of the processing vessel 2, the inside of the processing vessel 2 can be kept in a desirable quality of vacuum. At a side wall of the processing vessel 2, a gate valve 17 is provided. Opening and closing of the gate valve 17 is performed when the wafer W is loaded into the processing vessel 2 or unloaded from the processing vessel 2.

A controller 100 for performing overall control of the plasma processing apparatus 1 is provided to the plasma processing apparatus 1. The controller 100 includes a CPU 105, a ROM (Read Only Memory) 110, and a RAM (Random Access Memory) 115. The CPU 105 executes a desired plasma treatment such as etching, in accordance with a recipe stored in a memory region such as the RAM 115. The recipe includes control information of the apparatus corresponding to a process condition, such as a time required for the process, a pressure (of exhaust gas), power or voltage of the radio frequency power source, an amount of flow of each gas, a temperature inside the processing vessel (such as a temperature of the upper electrode, a temperature of an inner wall of the processing vessel, a temperature of the wafer W, and a temperature of the electrostatic chuck), and a temperature of coolant output from the chiller 36. Such a recipe indicating a process or a program may be stored in a hard disk drive or a semiconductor memory. Alternatively, the recipe may be stored in a removable storage medium such as a CD-ROM or a DVD, and the removable storage medium may be loaded in a predetermined place in an accessible state.

When plasma treatment, such as etching and depositing, is applied to the wafer W, opening and closing of the gate valve 17 is controlled, and the wafer W is loaded into the processing vessel 2 and placed on the stage 3. When a positive or negative DC voltage is applied from the DC power source 30 to the chuck electrode 10a, the wafer W is attracted and held to the electrostatic chuck 10.

Given gas is introduced into the processing vessel 2 from the gas supply source 23. The first high frequency power HF is applied to the stage 3 from the first radio frequency power source 32, and the second high frequency power LF is applied to the stage 3 from the second radio frequency power source 34. A negative DC voltage is applied to the gas shower head 20 by the variable DC power supply 26. As a result, gas is dissociated and plasma is generated above the wafer W. Further, by an effect of the plasma, plasma treatment is applied to the wafer W.

After plasma treatment, DC voltage having an opposite polarity to the polarity when the wafer W is attracted is applied from the DC power source 30 to the chuck electrode 10a, to remove electrical charge of the wafer W. After removing the electrical charge, the wafer W is removed from the electrostatic chuck 10, and is unloaded from the gate valve 17 to an outside of the processing vessel 2.

[Occurrence of Bowing]

Figure 2A:
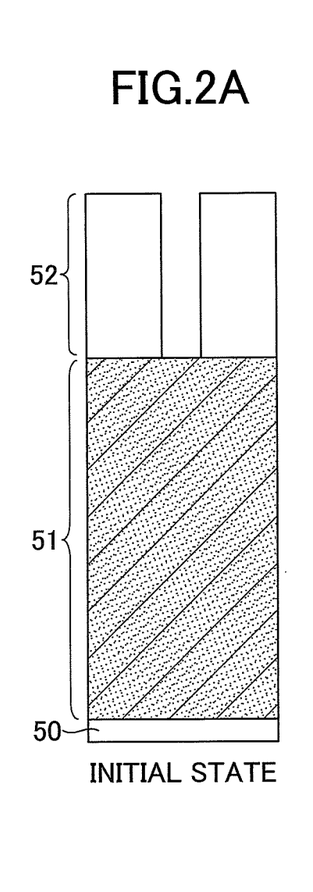
FIGS. 2A to 2D are diagrams illustrating an example of an etching method according to a comparative example.
Figure 2B:
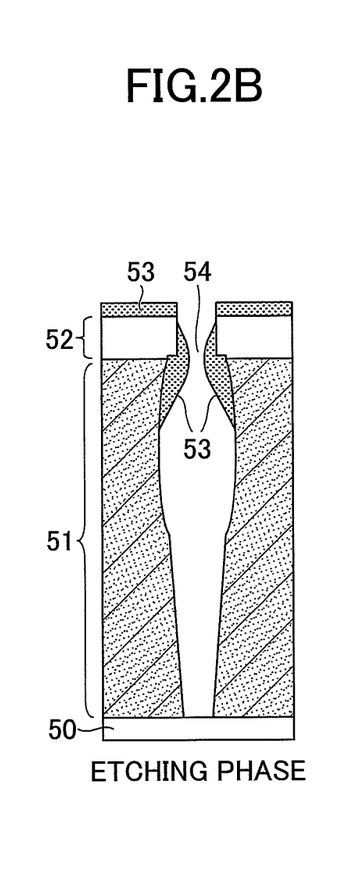

With reference to FIGS. 2A to 2D, a mechanism how a bowing is produced during etching will be described. FIG. 2A is an example of an initial state of a substrate, in which silicon oxide film 51 is deposited on a silicon substrate 50 and a mask 52 is formed on the silicon oxide film 51. In an etching phase, etching (main etching) of the silicon oxide film 51 is performed in a pattern of the mask 52, by using plasma. During the etching phase, as illustrated in FIG. 2B, a reaction product 53, which is generated by the etching, adheres to a part of side surfaces of a hole or groove formed in the silicon oxide film 51 near an opening 54 (the opening 54 is located at the level of an interface between the silicon oxide film 51 and the mask 52). The reaction product 53 also adheres to an upper surface and a side surface of the mask 52.

Figure 2C:
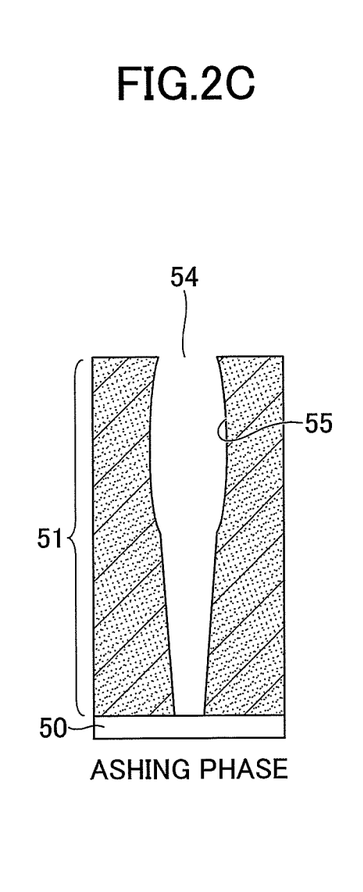
Figure 2D:
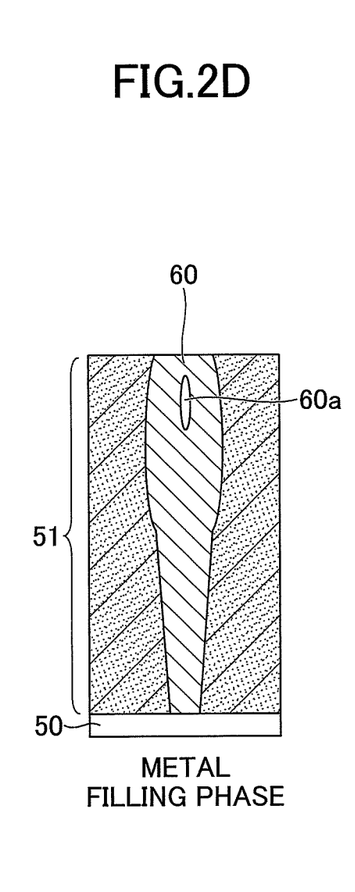

Because the reaction product 53 makes the opening 54 narrow, ions in the plasma do not enter the silicon oxide film 51 vertically, but enter obliquely. As a result, a profile of a hole or groove formed in the silicon oxide film 51 by the etching will be in an inverted tapered shape, in which a width of the hole or groove close to the opening 54 is narrower than at a bottom side (hereinafter, the hole or groove formed in the silicon oxide film 51 by the etching will be referred to as an "etching pattern"). Accordingly, as illustrated in FIG. 2C, a profile of the etching pattern of the silicon oxide film 51 after the mask 52 is removed by ashing will be in a state where a side wall of the etching pattern is curved towards the outside (that is, the state in which a bowing 55 is generated). When the etching pattern is filled with metal 60 such as tungsten by performing a post-process as illustrated in FIG. 2D, if a bowing is present in the etching pattern, a filling defect, in which a gap (void) 60*a* is generated, is likely to occur. Because the filling defect affects electrical characteristics of a device, the filling defect should preferably be eliminated.

In an etching method according to the present embodiment, after main etching and before ashing, by performing a step of removing a reaction product 53 adhering to vicinity of the opening 54 of the silicon oxide film 51, and by performing a step of etching a side wall of the silicon oxide film 51 and a side wall of the mask 52, a profile of the opening of the silicon oxide film 51 is made to be vertical and generation of a bowing is prevented. By performing the above steps, in a post-process following the ashing of the mask, for filling an etching pattern of the silicon oxide film with metal, occurrence of a filling defect is prevented.

[Etching Process]

Figure 3:
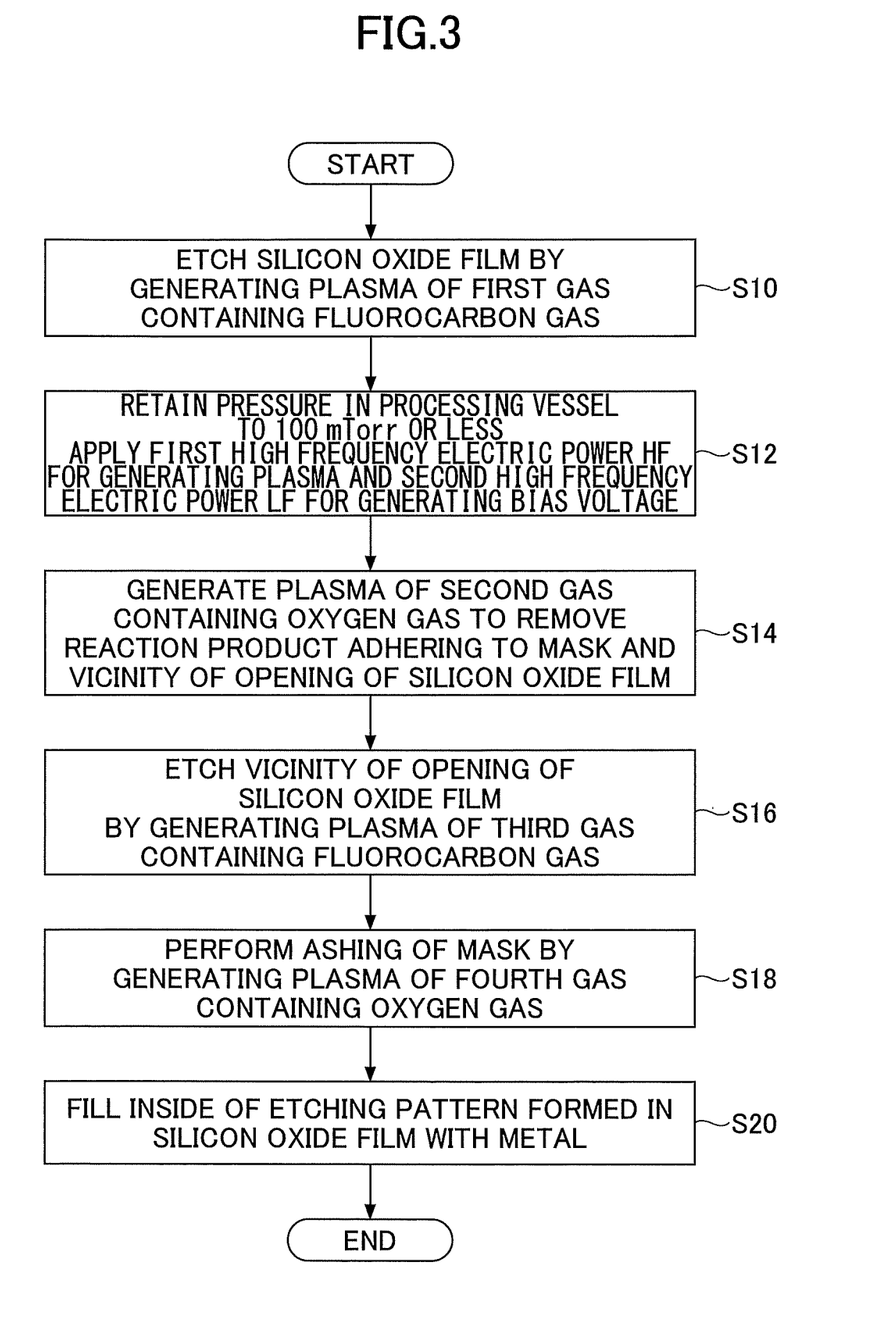
FIG. 3 is a flowchart illustrating an example of a flow of the etching process according to the present embodiment.

In the following, with reference to FIG. 3 and FIGS. 4A to 4F, an etching process performed in the plasma processing apparatus 1 according to the present embodiment will be described. FIG. 3 is a flowchart illustrating an example of a flow of the etching process according to the present embodiment. A control of the flow of the etching process illustrated in FIG. 3 is performed by the CPU 105 in the controller 100 in accordance with a recipe stored in the RAM 115.

Figure 4A:
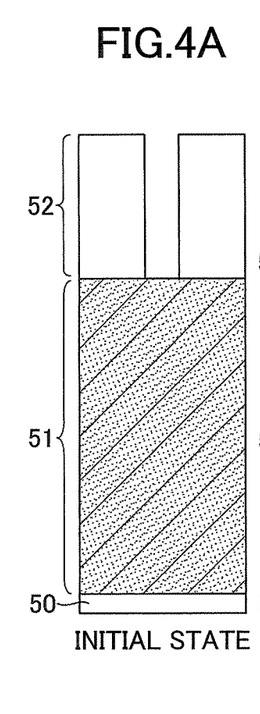
FIGS. 4A to 4F are diagrams illustrating an example of an etching method according to the present embodiment.

FIGS. 4A to 4F are diagrams illustrating an example of an etching method according to the present embodiment. An example of an initial state of film to be etched (hereinafter, the film to be etched may be referred to as "etching target film") is illustrated in FIG. 4A. In the present embodiment, a case in which silicon oxide ($SiO_2$) film 51 is etching target film will be described. On the silicon oxide film 51, a mask 52 having a predetermined mask pattern is provided. The silicon oxide film 51 is formed on a silicon substrate 50 and the mask 52 is formed on the silicon oxide film 51.

The etching target film is not limited to silicon oxide ($SiO_x$) film, as long as the etching target film is silicon-containing oxide film. Other examples of etching target film include silicon nitride ($SiN_x$) film, or a layered film of silicon oxide film and silicon nitride film.

The mask 52 may be formed of carbon or organic film.

When the etching process illustrated in FIG. 3 is started, the CPU 105 executes etching of the silicon oxide film 51 by generating plasma of a first gas containing fluorocarbon gas (step S10: etching step). Step 10 is an example of a first step of etching silicon-containing oxide film in a pattern of a mask, by plasma generated from a first gas supplied to the processing vessel 2.

Figure 4B:
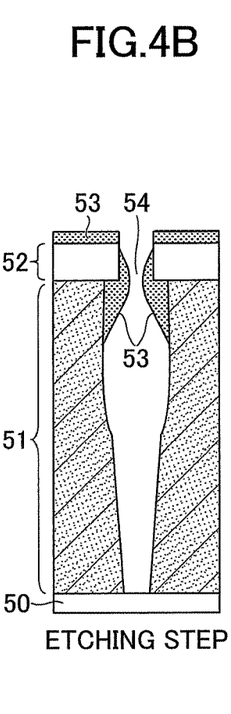
Figure 4C:
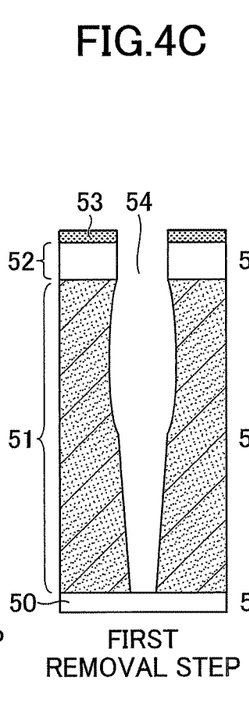

The etching step (step S10) is a main etching step of the silicon oxide film 51. When the etching step at step S10 is performed, an etching pattern such as a hole or groove is generated in the silicon oxide film 51, as illustrated in FIG. 4B. During the etching, the reaction product 53 is generated and adheres to the vicinity of the opening 54 of the silicon oxide film 51 (hereinafter, the opening 54 may also be referred to as an "opening of the etching pattern") and to an upper surface and a side surface of the mask 52. The reaction product 53 is a mixture of a CF based polymer contained in the first gas and a residue of the organic mask.

Referring back to FIG. 3, after the etching step at step S10, the CPU 105 executes removing of the reaction product 53 at step S12 and step S14. Specifically, the CPU 105 controls a pressure in the processing vessel 2 such that the pressure is maintained to be not more than 100 mTorr (13.32 Pa). The CPU 105 also applies the first high frequency electric power HF for generating plasma and the second high frequency electric power LF for generating bias voltage to the stage 3 (step S12). Subsequently, the CPU 105 executes generation of plasma of a second gas containing $O_2$ gas to remove the reaction product 53 adhering to the vicinity of the opening 54 of the silicon oxide film 51 and to the side surface of the mask 52 (step S14: a first removal step). Step S14 is an example of a second step in the method of removing a reaction product that has adhered to vicinity of an opening of silicon-containing oxide film and to a mask.

In the first removal step, the reaction product 53, which was generated at the etching step illustrated in FIG. 4B, is mainly removed. At this step, by using $O_2$ gas plasma, the side wall of the mask 52 is etched while removing the reaction product 53. Since the opening 54 is widened by performing this step, etching of the opening 54 and the vicinity of the opening 54, to be performed in a second removal step, can be facilitated.

Further, in the first removal step, not only the first high frequency electric power HF for generating plasma but also the second high frequency electric power LF for generating bias voltage is applied. In an ashing step corresponding to a fourth step, the second high frequency electric power LF for generating bias voltage is not applied, and the reaction product is chemically removed by $O_2$ radicals. On the other hand, in the first removal step, by applying the second high frequency electric power LF, the reaction product can be physically removed by ions. In addition, while a pressure in the processing vessel is more than 100 mTorr in the asking step, a pressure in the processing vessel in the first removal step is set to not more than 100 mTorr. By performing the first removal step, the reaction product 53 that has adhered to the vicinity of the opening 54 of the silicon oxide film 51 and to the side wall of the mask 52 is removed. As a result, the opening 54 is widened and a profile of the side wall near the opening 54 can be improved, such that an inverted tapered shape is changed to a vertical shape.

Referring back to FIG. 3, the CPU 105 next executes etching of the vicinity of the opening 54, by generating plasma of a third gas containing fluorocarbon gas (step S16: a second removal step). Step 16 is an example of a third step in the method of etching the vicinity of the opening of the silicon-containing oxide film, by plasma generated from a third gas supplied to the processing vessel.

Figure 4D:
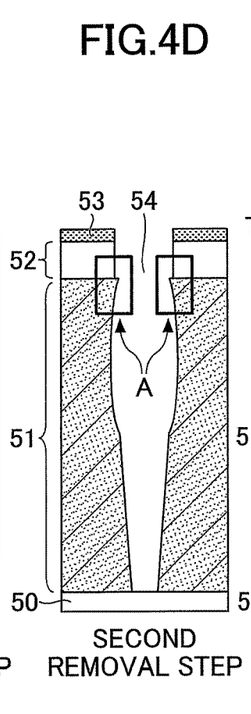

In the second removal step, the etching is performed by using plasma of gas not causing deposition easily such as $CF_4$ gas. By performing the second removal step, an entire etching pattern, including a region indicated by a frame A in FIG. 4D, is formed. As a result, the opening 54 becomes wider and a profile of the side wall near the opening 54 can be further improved, such that an inverted tapered shape is changed to a vertical shape.

Referring back to FIG. 3, the CPU 105 next performs ashing of the mask 52 by generating plasma of a fourth gas containing $O_2$ gas (step S18: an ashing step). Step S18 is an example of a fourth step in the method of performing ashing of a mask, by plasma generated from a fourth gas containing oxygen gas supplied to the processing vessel. In the ashing step, a pressure in the processing vessel is controlled such that the pressure is more than 100 mTorr.

Figures 4E, 4F:
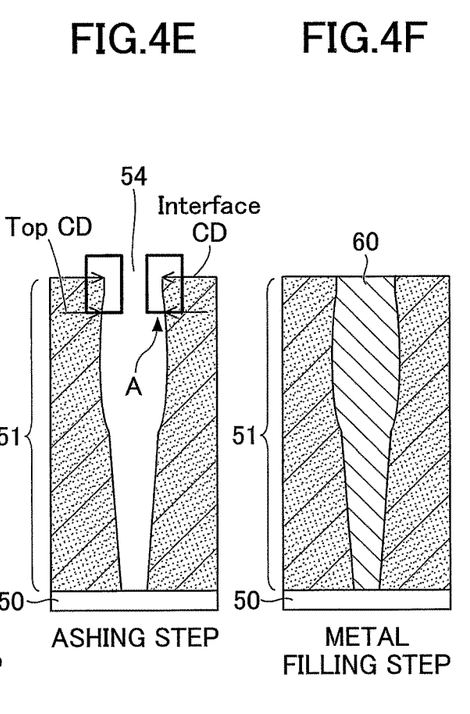

In the etching process according to the present embodiment, by performing the first removal step and the second removal step, an etching profile of the silicon oxide film 51 is improved, as illustrated in FIG. 4E, such that the opening 54 becomes widened, the side wall near the opening 54 becomes approximately vertical, and bowing is not generated.

Referring back to FIG. 3, the CPU 105 next executes filling an inside of the etching pattern formed in the silicon oxide film 51 with metal such as tungsten, copper, or aluminum (step S20: a metal filling step), and terminates the process. Step S20 is an example of a fifth step in the method of filling an inside of an etching pattern formed in silicon-containing oxide film with metal, which is performed after the fourth step.

In the etching method according to the present embodiment, the first removal step (FIG. 4C) and the second removal step (FIG. 4D) are performed between the etching step (FIG. 4B) and the ashing step (FIG. 4E). In the first removal step, the reaction product 53 adhering to vicinity of the opening 54 and the side surface of the mask 52 is removed by plasma of gas containing $O_2$ gas. Accordingly, the opening 54 of the etching pattern is widened and a profile of the side wall near the opening 54 can be improved, such that an inverted tapered shape is changed to a vertical shape.

Further, in the second removal step, by performing etching using plasma of gas containing fluorocarbon gas, the opening 54 becomes wider and a profile of the side wall near the opening 54 can be further improved, such that an inverted tapered shape is changed to a vertical shape.

As a result, in a post-process for filling the inside of the etching pattern formed in the silicon oxide film 51 with metal illustrated in FIG. 4F, occurrence of a filling defect (void) is prevented. Therefore, according to the method in the present embodiment, a device having good electrical characteristics can be manufactured.

The second removal step at step S16 can be omitted. That is, if the asking step is performed after performing the first removal step (without performing the second removal step), the opening 54 can be widened and occurrence of a filling defect can be prevented when the inside of the etching pattern formed in the silicon oxide film 51 is filled with metal. However, it is preferable that the second removal step is performed because the opening 54 becomes wider and a profile of the side wall near the opening 54 become close to a vertical shape, by performing the second removal step after the first removal step.

The reason that a pressure in the processing vessel 2 is set to not more than 100 mTorr in the second step (the first removal step) and is set to more than 100 mTorr in the fourth step (the aching step) will be described in the following. In the second step, fluorine contained in the reaction product adhering to the wafer W or to the inside of the processing vessel is activated by $O_2$ radicals. Accordingly, in the second step, in order that the activated fluorine does not affect an etching profile, the pressure in the processing vessel 2 should preferably be controlled so as not to be more than 100 mTorr, so that the activated fluorine can be immediately exhausted. Conversely, in the fourth step, after the mask 52 is removed, over-etching to a certain degree is required. For this step, a process at a pressure in the processing vessel 2 more than 100 mTorr is less likely to cause shoulder dropping of the silicon oxide film 51 (a phenomenon that an edge of an upper part of the silicon oxide film 51 is partially removed and rounded). Therefore, in the fourth step, the pressure in the processing vessel 2 should preferably be controlled so as to be more than 100 mTorr.

[Types of Gases]

The first gas used in the etching step (the first step) is not limited to the gas containing fluorocarbon gas. Gas containing hydrofluorocarbon gas may be used as the first gas. Examples of the first gas include $C_4F_6$ gas, $C_4F_8$ gas, $CF_4$ gas, $CHF_3$ gas, $CH_2F_2$ gas. Alternatively, the first gas may be a mixed gas containing at least one of fluorocarbon gas and hydrofluorocarbon gas, $O_2$ gas, and inert gas such as Ar gas.

The second gas used in the first removal step (the second step) is a single gas of $O_2$ gas.

The third gas used in the second removal step (the third step) may be any type of gas, as long as fluorocarbon gas is contained. For example, the third gas may be a single gas of fluorocarbon gas, or may be a mixed gas containing fluorocarbon gas, $O_2$ gas, and inert gas such as Ar gas. Examples of the fluorocarbon gas include $C_4F_6$ gas, $C_4F_8$ gas, $CF_4$ gas, $CHF_3$ gas, $CH_2F_2$ gas.

The fourth gas used in the ashing step (the fourth step) is a single gas of $O_2$ gas.

The first gas used in the etching step (the first step) should preferably be gas of a type causing deposition easily during etching. Among fluorocarbon gases, gas causing deposition easily, such as $C_4F_6$ gas or $C_4F_8$ gas, should preferably be used as the first gas. Conversely, the third gas used in the second removal step (the third step) should preferably be gas of a type not causing deposition easily during etching. Among fluorocarbon gases, gas not causing deposition easily, such as $CF_4$ gas, should preferably be used as the third gas.

[Effect]

Figure 5:
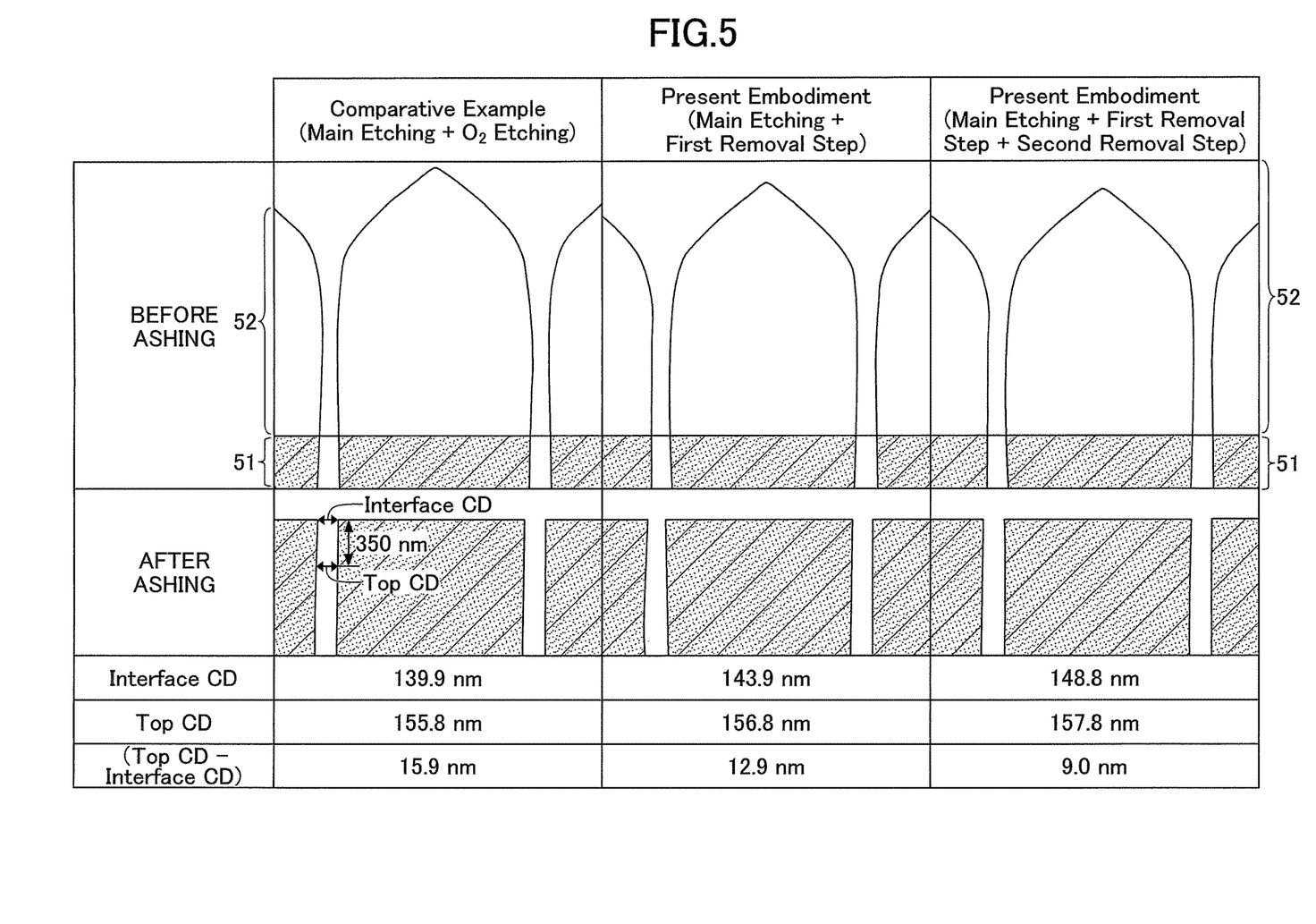
FIG. 5 illustrates a comparison between an etching profile formed by the etching method according to the present embodiment and an etching profile formed by the etching method according to the comparative example.

Lastly, with reference to FIG. 5, an effect of the etching process according to the present embodiment will be described. FIG. 5 illustrates a comparison between an etching profile formed by the etching method according to the present embodiment and an etching profile formed by the etching method according to a comparative example.

A third column from the right in FIG. 5 illustrates an experimental result (a) of the comparative example. In the comparative example, after CF-based etching was applied to the etching target film (the silicon oxide film 51 and the mask 52), oxide etching using $O_2$ gas plasma was performed. In a second row (a row labeled "Before Ashing") of the third column from the right, an example of a state of the etching target film after the above CF-based etching and oxide etching were performed is illustrated. Subsequently in the comparative example, the mask 52 was removed by ashing. An example of a state of the etching target film after ashing is illustrated in a third row (a row labeled "After Ashing") of the third column from the right.

A second column from the right in FIG. 5 illustrates an experimental result (b) of a first example of the present embodiment. In the first example of the present embodiment, after the main etching (the first step) was applied to the etching target film, the first removal step (the second step)

was performed. In the second row of the second column from the right, an example of a state of the etching target film after the above main etching and the first removal step were performed is illustrated. Subsequently in the first example, the mask 52 was removed by ashing. An example of a state of the etching target film after ashing is illustrated in the third row of the second column from the right.

A rightmost column in FIG. 5 illustrates an experimental result (c) of a second example of the present embodiment. In the second example of the present embodiment, after the main etching (the first step) was applied to the etching target film, the first removal step (the second step) was performed. Also, the second removal step (the third step) was performed after the first removal step. An example of a state of the etching target film after the above first to third steps were performed is illustrated in the second row of the rightmost column. Subsequently in the second example, the mask 52 was removed by ashing. An example of a state of the etching target film after ashing is illustrated in the third row of the second column from the right.

In the above mentioned experiments, as illustrated in third to fifth rows of FIG. 5, an interface CD (Critical Dimension) and a top CD were measured. The interface CD represents a width of the opening of the etching pattern that is on the surface of the silicon oxide film 51. The top CD represents a width of the etching pattern in a depth of 350 nm from the surface of the silicon oxide film 51.

As illustrated in FIG. 5, in the experimental result (a) of the comparative example, the interface CD was "139.9 nm" and the top CD was "155.8 nm". As a result, a difference between the top CD and the interface CD was 15.9 nm.

On the other hand, in the experimental result (b) of the first example of the present embodiment, the interface CD was "143.9 nm" and the top CD was "156.8 nm". As a result, a difference between the top CD and the interface CD was 12.9 nm.

Further, in the experimental result (c) of the second example of the present embodiment, the interface CD was "148.8 nm" and the top CD was "157.8 nm". As a result, a difference between the top CD and the interface CD was 9.0 nm.

That is, in the etching method according to the first example of the present embodiment (Main Etching+First Removal Step) and in the etching method according to the second example of the present embodiment (Main Etching+First Removal Step+Second Removal Step), as compared to the etching method according to the comparative example, the opening 54 of the silicon oxide film 51 became wider and verticality of the side wall in the vicinity of the opening 54 was improved.

Specifically, in the etching method according to the first example of the present embodiment, the difference between the top CD and the interface CD decreased by "3.0 nm" (from 15.9 nm in the comparative example to 12.9 nm), and a profile of the side wall in the vicinity of the opening 54 was improved from an inverted tapered shape to a vertical shape.

Further, in the etching method according to the second example of the present embodiment, the difference between the top CD and the interface CD decreased by "6.9 nm" as compared to the comparative example. Also, as compared to the first example of the present embodiment, in the etching method according to the second example of the present embodiment, the difference between the top CD and the interface CD decreased by "3.9 nm". Accordingly, verticality of the side wall in the vicinity of the opening 54 was further improved.

Further, in both the etching method according to the first example of the present embodiment and the etching method according to the second example of the present embodiment, the opening 54 of the silicon oxide film 51 became wider as compared to the etching method according to the comparative example. Specifically, with respect to a width of the opening 54 represented by the interface CD, in the etching method according to the first example of the present embodiment, the width of the opening 54 increased from 139.9 nm in the comparative example to 143.9 nm. Further, in the etching method according to the second example of the present embodiment, the width of the opening 54 increased to 148.8 nm.

From the above experimental results, it was proved that the opening 54 of the silicon oxide film 51 becomes wider and verticality of the side wall in the vicinity of the opening 54 is improved, by performing the first removal step according to the present embodiment after a main etching and before ashing. According to the first example of the present embodiment, because an etching profile of silicon-containing oxide film is improved by dry etching, in a post-process following ashing, in which an etching pattern of the silicon oxide film 51 is filled with metal (may be referred to as a "fifth step"), occurrence of a filling defect is prevented. Therefore, a device having good electrical characteristics can be manufactured.

Further, in the etching method according to the second example of the present embodiment, by performing the second removal step after performing the first removal step after a main etching and before ashing, the opening 54 of the silicon oxide film 51 becomes further wider and verticality of the side wall in the vicinity of the opening 54 is further improved. Accordingly, in the post-process following ashing, occurrence of a filling defect can be further prevented; therefore, a device having good electrical characteristics can be manufactured.

In the above embodiment, an etching method has been described. However, an etching method according to the present invention is not limited to the above embodiment. Various changes or enhancements can be made hereto within the scope of the present invention. Matters described in the above embodiments may be combined unless inconsistency occurs.

The plasma processing apparatus according to the present invention can be applicable to any type of plasma processing apparatuses, such as a capacitively coupled plasma (CCP) type, an inductively coupled plasma (ICP) type, a radial line slot antenna type, an electron cyclotron resonance plasma (ECR) type, and a helicon wave plasma (HWP) type.

In this specification, the semiconductor wafer W is referred to as an example of a substrate. However, the substrate processed by the plasma processing apparatus is not limited to the semiconductor wafer W. Examples of the substrate may include various types of substrates used in an LCD (Liquid Crystal Display) or a FPD (Flat Panel Display), a photomask, a CD substrate, and a printed circuit board.

What is claimed is:
1. An etching method comprising:
   a) placing a substrate on a stage in a chamber, the substrate having a silicon oxide film and a patterned mask disposed on the silicon oxide film;
   b) providing a first phase including
      supplying a first gas including a first fluorocarbon gas into the chamber,
      forming a first plasma from the first gas in the chamber, and exposing the substrate to the first plasma to etch the silicon oxide film, thereby causing a recess to be formed into the silicon oxide film through the patterned mask and causing a reaction product to be deposited on the recess and the patterned mask in the vicinity of an opening of the recess;

c) providing a second phase including supplying a second gas including an oxygen gas into the chamber, forming a second plasma from the second gas in the chamber by applying a first high frequency electric power and a second high frequency electric power to the stage, the first high frequency electric power being different from the second high frequency electric power, and exposing the substrate to the second plasma to etch the patterned mask while removing the reaction product; and d) providing a third phase including supplying a third gas including a second fluorocarbon gas into the chamber, the second fluorocarbon gas being different from the first fluorocarbon gas, forming a third plasma from the third gas in the chamber, and exposing the substrate to the third plasma to etch the silicon oxide film in the vicinity of the opening.

2. The etching method according to claim 1, wherein a pressure in the chamber is maintained to be not more than 100 mTorr (13.32 Pa) during the second phase.

3. The etching method according to claim 1, further comprising e) providing a fourth phase of performing ashing, the fourth phase including supplying a fourth gas containing oxygen gas into the chamber, forming a fourth plasma from the fourth gas in the chamber, and exposing the substrate to the fourth plasma to remove the mask on the silicon oxide film.

4. The etching method according to claim 3, further comprising f) providing a fifth phase of filling an etching pattern formed in the silicon oxide film with metal.

5. The etching method according to claim 1, wherein the first fluorocarbon gas is $C_4F_6$ gas or $C_4F_8$ gas, and the second fluorocarbon gas is $CF_4$ gas.

6. The etching method according to claim 3, wherein a pressure in the chamber is equal to or less than 100 mTorr during the second phase, and a pressure in the chamber is more than 100 mTorr during the fourth phase.

* * * * *